(12) United States Patent
Lum

(10) Patent No.: US 6,847,065 B1
(45) Date of Patent: Jan. 25, 2005

(54) RADIATION-HARDENED TRANSISTOR FABRICATED BY MODIFIED CMOS PROCESS

(75) Inventor: Wing Y. Lum, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/417,021

(22) Filed: Apr. 16, 2003

(51) Int. Cl.$^7$ .............................................. H01L 29/78
(52) U.S. Cl. ..................... 257/221; 257/219; 257/354
(58) Field of Search ................................ 257/219, 221, 257/347, 354

(56) References Cited

U.S. PATENT DOCUMENTS

| | | | |
|---|---|---|---|
| 5,619,053 A | * | 4/1997 | Iwamatsu et al. ........... 257/347 |
| 6,184,556 B1 | * | 2/2001 | Yamazaki et al. .......... 257/354 |
| 6,583,474 B2 | * | 6/2003 | Yamazaki et al. .......... 257/354 |
| 6,621,116 B2 | * | 9/2003 | Church ....................... 257/314 |

* cited by examiner

*Primary Examiner*—Allan R. Wilson
(74) *Attorney, Agent, or Firm*—William C. Schubert; Karl A. Vick

(57) ABSTRACT

An NMOS field effect transistor (1) is made radiation hard by a pair of guard band implants (115) of limited horizontal extent, extending between the source (30A) and drain (30B) along the edge of the transistor body, and extending only to a limited extent into the field insulator and into the interior of the transistor, leaving an unimplanted area in the center of the body that retains the transistor design threshold voltage.

8 Claims, 4 Drawing Sheets

RADIATION-HARDENED TRANSISTOR FABRICATED BY MODIFIED CMOS PROCESS

TECHNICAL FIELD

The field of the invention is radiation-hardened integrated circuits made by a CMOS process.

BACKGROUND OF THE INVENTION

As transistor and other integrated circuit (IC) dimensions shrink, the circuits become more susceptible to the effects of ionizing radiation. For example, capacitors in DRAMs may be discharged, cells in SRAMs may change state and other deleterious effects may occur as a result of stray charge and ionizing radiation from radioactive materials or from cosmic rays.

In addition, charge released by an ionizing particle may be trapped in an oxide or nitride layer and increase leakage across a junction, or along a path that nominally blocks charge flow. For example, charge trapped in the gate oxide of an NMOS transistor may decrease the threshold of the transistor and thus increase the leakage between source and drain in the off state, as well as changing the time during a voltage ramp when it turns on. Charge trapped in the field oxide surrounding the device may form a leakage path along the vertical edge of the transistor body between the source and drain (S/D). The overall effects of radiation-induced damage can result in spurious circuit operation or even in non-functional devices on an integrated circuit.

Special hardening techniques, such as field hardening, have been developed in an attempt to address these problems. However, these processes are non-standard and are not readily integrated into a conventional IC fabrication line, and thus their use incurs substantial additional cost and complexity, especially for relatively low volume production runs (e.g., some hundreds or a few thousand ICs).

SUMMARY OF THE INVENTION

The invention relates to a method of constructing a transistor, such as an NMOS field effect transistor, by adding a step of implanting an area under the gate extending in a first direction between the source and drain, and in a second direction overlapping both the outer edge of the transistor body and an adjacent isolating insulator. The implant may thus be considered to form guard band structures for the transistor that beneficially substantially eliminates the undesirable effects of ionizing radiation. The resulting transistor device is thus radiation hardened, but in a manner that is compatible with conventional IC fabrication line procedures and equipment, and thus in a manner that significantly reduces both cost and complexity.

A feature of the invention is that the area implanted is limited and does not cover the entire length of the transistor source and drain.

Another feature of the invention is that the implant is made only at the edges of the transistor body.

A method of this invention of forming a field effect transistor comprises: (a) preparing a semiconductor substrate; (b) defining an active area containing a source area that will contain a source and a drain area that will contain a drain, the source area and the drain areas being separated by a body area; (c) forming isolating trench dielectric surrounding the active area, the isolating trench dielectric abutting the body area and the source area and the drain area; (d) implanting a radiation implant at two guard bands on opposite sides of the active area, extending outward from an edge of the active area into the isolating trench dielectric by an implant field distance and extending inward from the edge of the active area into the body by an implant body distance and separated by an unimplanted area; and (e) forming a gate insulator, a gate and a source and drain of the transistor.

Further in accordance with this invention there is provided a field effect transistor that includes an active area formed in a semiconductor substrate; a source and drain separated by a transistor body formed in the active area; isolating trench dielectric disposed around the active area and a gate disposed over a gate insulator and extending along a gate axis, the gate being disposed between the source and drain. In accordance with an aspect of this invention the transistor further includes a first guard band and a second guard band that are each implanted with a radiation dose of ions on opposite sides of the active area. The guard bands have axes perpendicular to the gate axis, extending outward from an edge of the active area by an implant field distance and extending inward from the edge of the active area by an implant body distance, and separated by an unimplanted area of the transistor body.

BEST MODE OF CARRYING OUT THE INVENTION

Figure 1:
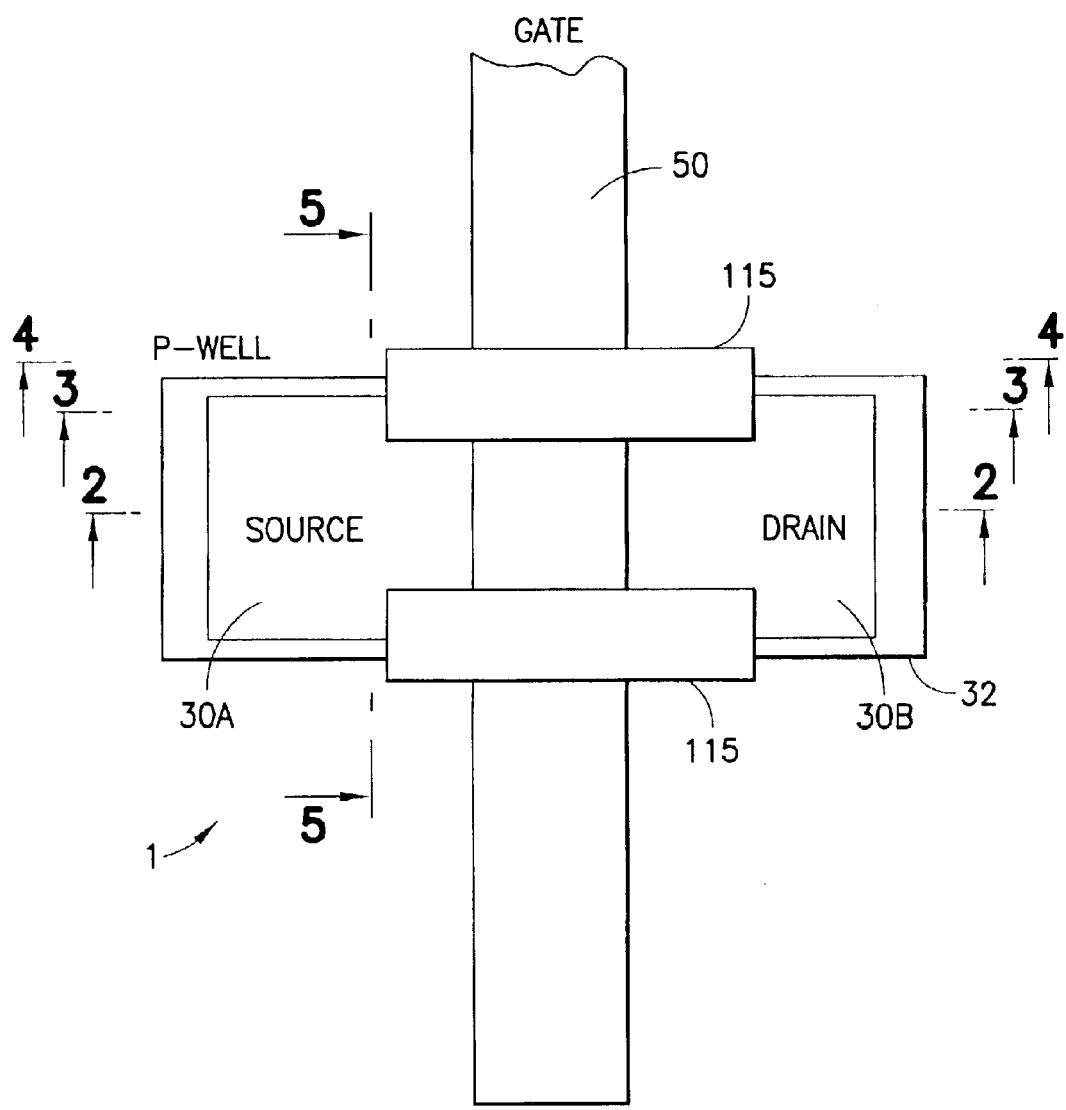
FIG. 1 shows a top view of a transistor formed according to the invention.

FIG. 1 shows a top view of field effect transistor (FET) 1, such as an NFET, implanted with a radiation-hardening implant forming guard bands 115 according to the invention.

The FET 1 has a source 30A and a drain 30B bisected by a gate 50 that extends past the transistor body in the vertical direction in the drawing. The FET 1 is located in a P-well that can be formed by a conventional method. Two areas of the FET structure, referred to as the guard bands 115, are implanted with a dose of ions to suppress leakage caused by radiation (referred to as a leakage-suppressing dopant and having the same polarity as the FET body). The areas extend along the edges of the transistor body covering the area where the gate 50 crosses the edge of the body and extends into the S/D.

The FET 1 is surrounded by a trench field insulator 20, illustratively CVD oxide deposited in a shallow trench. If space and the thermal budget permit, the insulation could be a thermal oxide also. Having the field insulator surround the entire FET 1 is not required, and layouts in which one of the source 30A and drain 30B extend to make contact with another circuit element (e.g. DRAM arrays in which two FETs share an electrode that is also the bitline) are included within the invention. The phrase "at least two sides" referring to the active area indicates to one skilled in the art that the field insulator is located adjacent to the body and overlapping the source and drain, so that it blocks current between the source and drain. Arrows 2—2, 3—3, 4—4 and 5—5 indicate the location of cross sections discussed below in relation to FIGS., 2, 3, 4 and 5, respectively.

Figure 2:
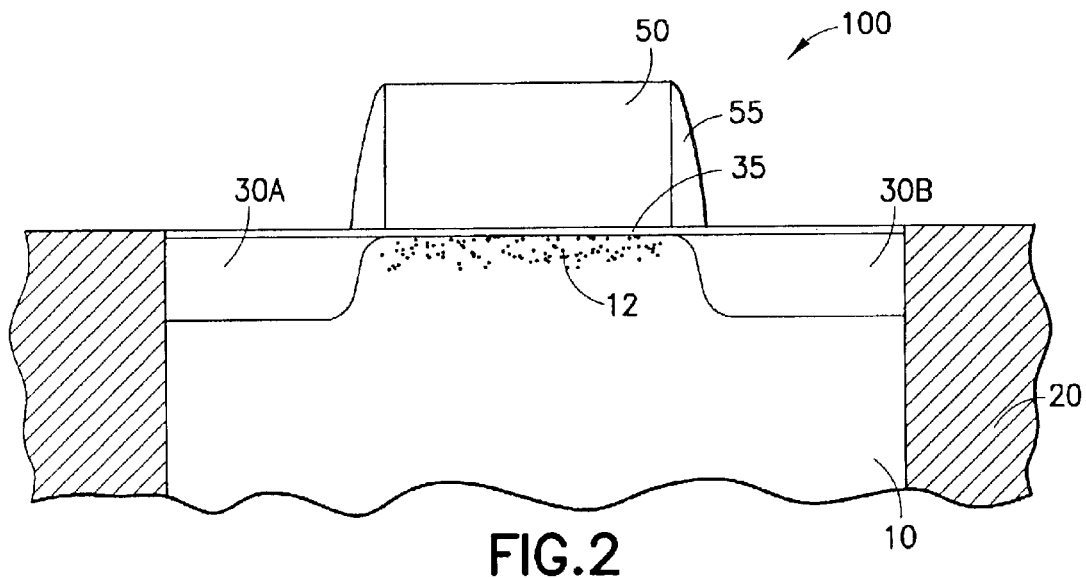
FIG. 2 is a cross section through the center of the transistor of FIG. 1, in a direction parallel to the gate.

FIG. 2 shows the first cross section, taken through the center of the FET 1 along line 2—2 in FIG. 1. As is indicated in FIG. 1, the doping does not extend through the entire width of the FET 1, so that the cross section shows a conventional transistor structure of an epitaxial silicon layer 10, bounded by oxide 20 on both sides. Source/drains 30A, 30B are formed in a conventional manner with LDD (Low-Doped Drain) source/drain extensions. Gate 50, deposited above gate oxide 35, has sidewalls 55 that serve to form the LDD areas. Gate 50 extends perpendicular to the plane of the paper. A conventional threshold implant is denoted by stippling 12 in the body 45 below gate oxide 35. It is an advantageous feature of the invention that the implant is not required to extend all the way across the FET 1, so that the design threshold of the FET 1 is not affected.

Figure 3:
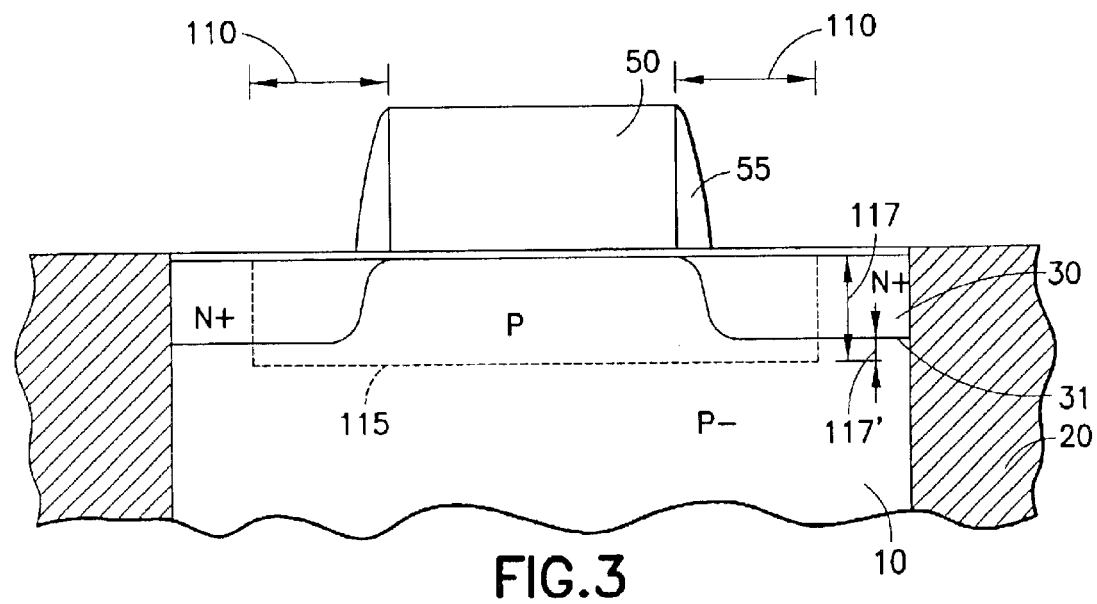
FIG. 3 is a cross section through the implanted area of the transistor, in a direction parallel to the gate.

Referring now to FIG. 3, there is shown a second cross section taken through the implanted area of the FET 1 body along line 3—3. The same source and drain, gate and gate oxide as shown in FIG. 2 are also present here. The radiation implant is denoted with stippling 115, extending between the source and drain and past the P-N junction between the N+ source/drain and the P– body by a margin to allow for alignment errors. The extent of the overlap between this implant and the source-drain boundary is not critical, as the implant in this area does not significantly affect the leakage current flow.

The implant extends up to the bottom of the gate oxide, overlapping in vertical extent the threshold adjust implant. The magnitude of the radiation implant will be much greater than that of the threshold adjust implant, so that the threshold of the FET 1 in this area is raised to a value greater than the operating voltage of the FET 1. With this relative magnitude, the part of the FET 1 body receiving the implant will not function in the FET 1. It is possible to reduce the magnitude of the radiation implant so that the area of the body does invert at a gate voltage less than the design gate voltage. This would produce a "kink" in the I-V curve that is undesirable, but may be tolerable in a closely packed digital circuit where space is a very important consideration and linear FET 1 operation is less important.

The main path for radiation-induced leakage current is along the vertical sides of the FET 1 body between the source 30A and drain 30B. Accordingly, it is preferable that the implant extend past the fall depth of the source and drain plus a tolerance margin, indicated by arrow 117 by a tolerance distance indicated by numeral 117'. The mechanism of inducing leakage is that (positive) charge liberated by radiation migrates through the field oxide until it is caught in traps within the oxide. Trapped charge that is close enough to the FET 1 body to invert the silicon and form a parasitic transistor will cause leakage.

The magnitude and lateral extent of the implant dose are set to prevent inversion and reduce subthreshold leakage for the expected amount of trapped charge. Since an NFET has a P-type body, it receives a P-type implant dose (e.g., Boron) to produce the desired result. Charge trapped in the gate oxide has the same effect, but to a lesser extent because of the higher quality of the thermal gate oxide.

Figure 4:
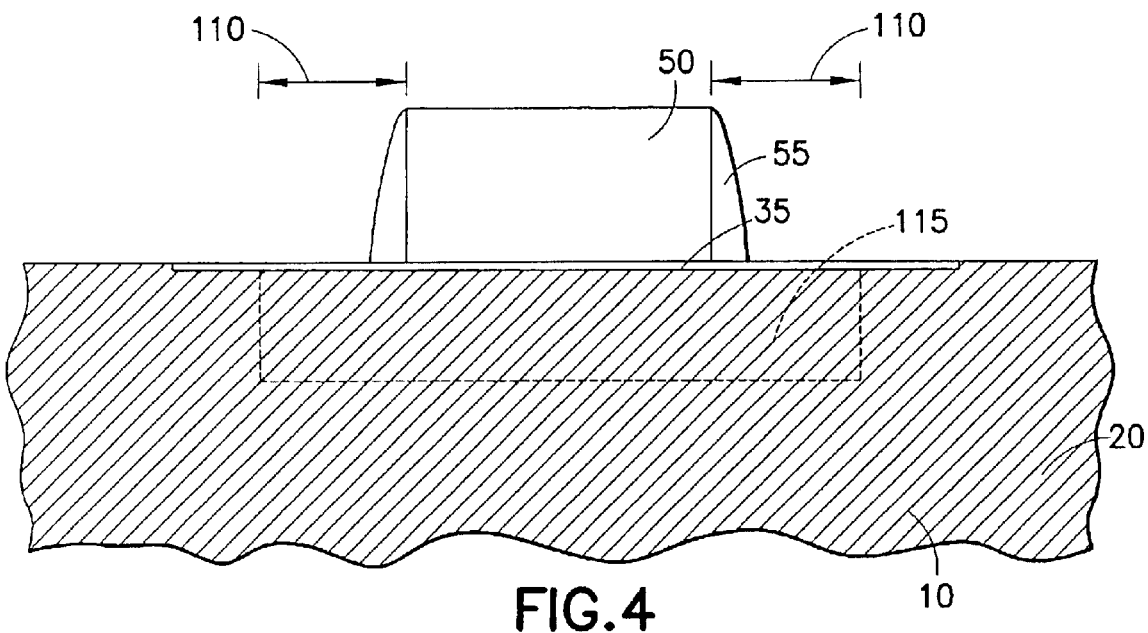
FIG. 4 is a cross section through the implanted area outside the transistor body, in a direction parallel to the gate.

FIG. 4 shows a corresponding cross section taken outside the FET 1 body along line 44 in FIG. 1. Gate 50 and gate oxide 35 are still present, but the source and drain do not appear, as they are behind the plane of the drawing paper. The implant is present in this location, both because a tolerance is desired to allow for alignment errors, and since trapped charge can cause leakage even when the trapped charge is not immediately adjacent to the silicon of the body, but is separated by a finite distance. It is preferred that the implant is done after a trench is etched is etched to hold insulator 20 and before insulator 20 is deposited. In that case, there will not be dopant in the insulator. The figures show for completeness an alternative embodiment in which the implant is performed after the trench has been filled with insulator 20.

Figure 5:
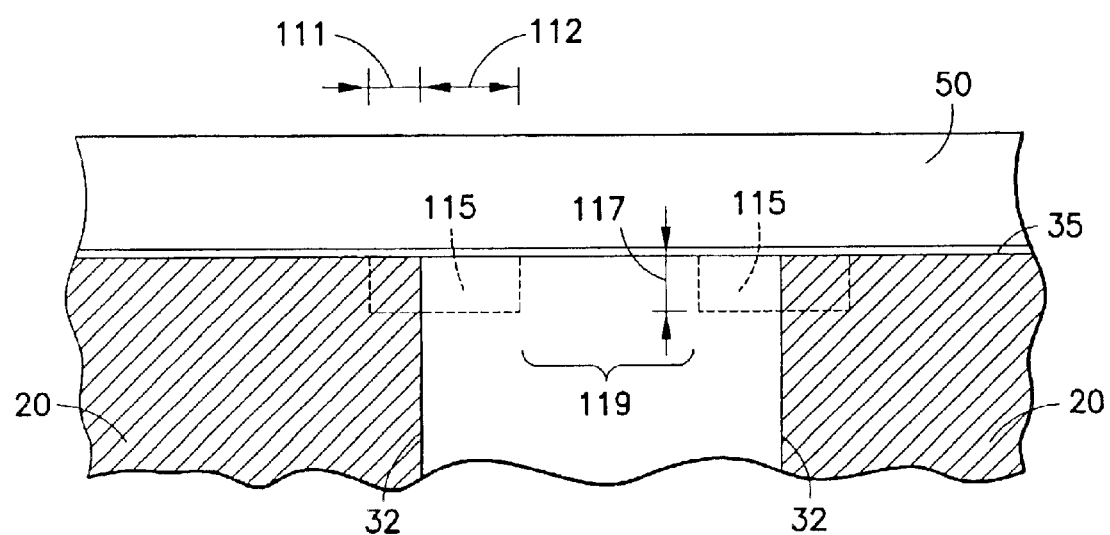
FIG. 5 is a cross section through the transistor in a direction perpendicular to the gate.

FIG. 5 shows the view looking from the source to the drain from line 5—5 along a direction perpendicular to the axis of gate 50. In this view, it can readily be seen that implants 115 extend past the body-oxide boundary 32 in both directions. In the example shown, the width of the FET 1 is greater than 1 micron and the nominal extent (denoted by numeral 112) of implant 115 into the FET 1 body (referred to as the implant body distance) is such that leakage from the maximum expected dose is suppressed and the nominal extent outside the FET 1 body (referred to as the implant field distance and denoted with numeral 111) is such as to allow for alignment errors so that the outer surface of the FET 1 body is doped. In an illustrative example, the distances were 0.3 micron and 0.3 micron, respectively. These specific distances are not necessarily optimized, and in practice the distances can be set at smaller values in order to conserve space. Since the implanted area of the FET 1 body does not contribute to the FET 1 operation, the effective width of the FET 1 is that between the two implanted areas, denoted with bracket 119 in FIG. 5. Accordingly, the smaller the width of the implant, the smaller the total area of the FET 1, for a given current capacity. The amount of the implanted area will depend on the expected ionizing radiation dose, since a greater amount of trapped charge will induce leakage over a greater range.

Figure 6:
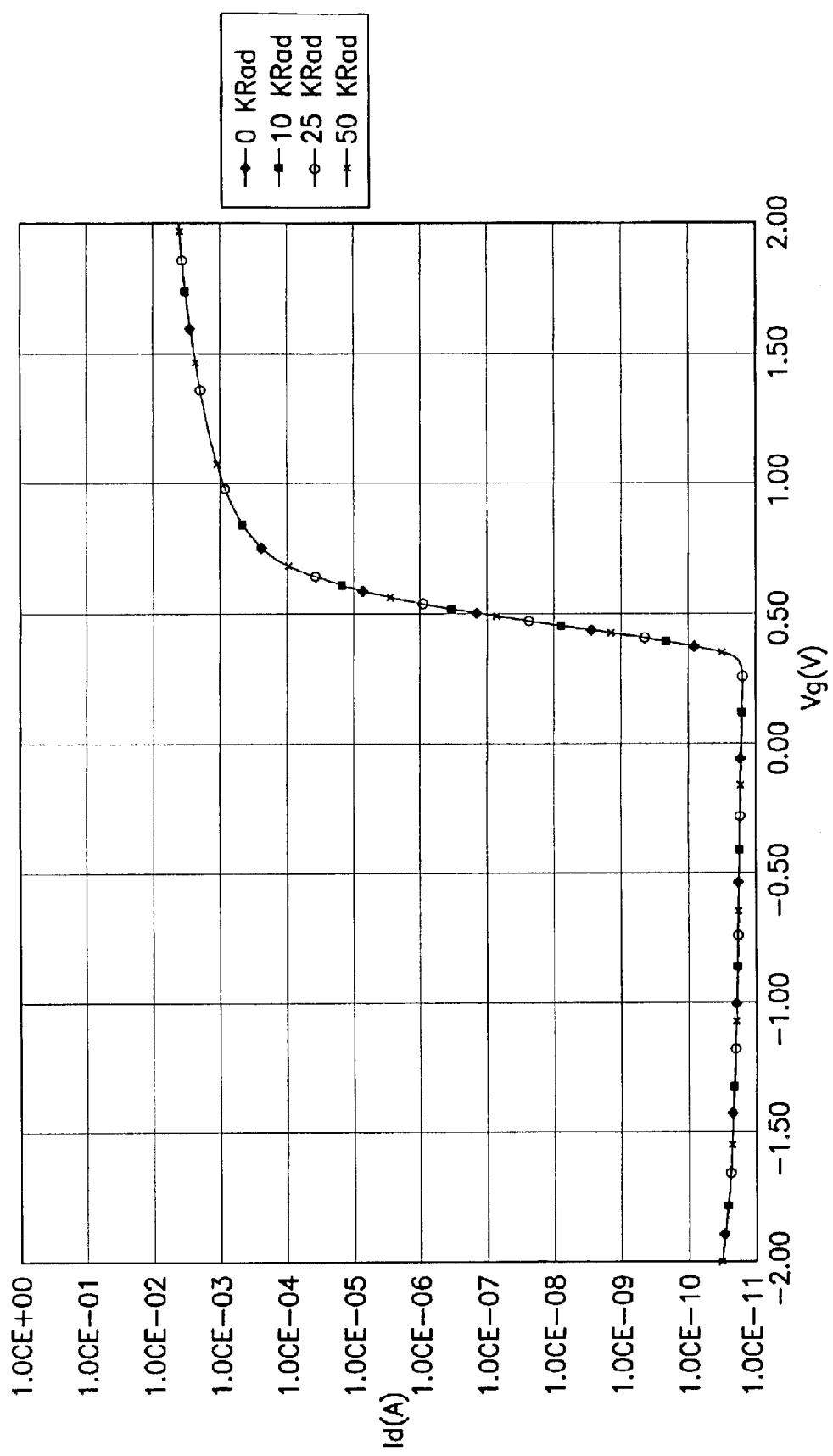
FIG. 6 is an I-V curve showing transistor operation for various radiation exposure levels.

FIG. 6 shows an I-V graph for an embodiment of the invention in which an NMOS transistor was irradiated with several doses up to and including 1 Mrad. As can be seen, the curves fall on one another, showing clearly that there was essentially no damage to the transistor by the implant, or by the ionizing radiation to which the transistor was exposed. The radiation-hardening of the transistor is thus apparent. In the example used for preparing the graph of FIG. 6 the implant species was Boron, the energy was 30 KeV and the total dose was $4 \times 10^{14}$ to $2.2 \times 10^5/cm^2$ producing an implant depth of approximately 150 nm to 200 nm that extended below the source/drain depth of approximately 100 nm to 150 nm. The implant distribution was chosen such that the threshold was raised to a desired magnitude sufficient to suppress radiation induced leakage, so the vertical overlap with the distribution of the threshold implant was not relevant, since the radiation implant dose determined the threshold in that area. The horizontal dimensions of the implanted region were sufficient on either side of the gate 50 to overlap the P-N junction between the source 30A and drain 30B and the transistor body, sufficient outside of the transistor body and along the gate axis to allow for alignment tolerance, and were sufficient inside the transistor body to suppress leakage from the maximum expected radiation dose.

The implant may be performed at any convenient time in the fabrication process, preferably before growth of the gate oxide 35. In the figures the implant is performed after formation of the field oxide 20, which reduces diffusion from thermal effects. In practice, the use of this invention requires an additional mask for the ion implant, but the extent of the implanted area is set with a tolerance such that the mask alignment is noncritical. Although an implant is preferred, a dopant may be introduced into the body and the field insulator by another method such as gas phase diffusion through an aperture in a diffusion mask (e.g. nitride) or by depositing a heavily doped substance (e.g. boron-doped poly-silicon) and heating it to drive the dopant into the adjacent material. In such a case, the term implant body distance and the like would be replaced by dopant body distance, etc.

It is an advantageous feature of the invention that the implanted area is compact, being only on the outer edges of the transistor body. The vertical range of the implant is from just below the gate oxide to below the bottom of the source and drain. The preferred implant ion species are the same as those used for threshold adjust implants for an NFET, e.g. Boron.

Those skilled in the art will readily be able to ascertain dopant doses and guard band widths required to tolerate various levels of radiation.

While disclosed herein in the context of presently preferred embodiments of this invention, those having skill in the art should appreciate that changes in detail and form made be made to these embodiments, and that equivalent methods and apparatus maybe employed, and that all such changes, modifications and equivalents will still fall within the scope of this invention.

What is claimed is:

1. A field effect transistor comprising:

an active area formed in a semiconductor substrate;

a source and drain separated by a transistor body formed in said active area;

isolating dielectric disposed on at least two sides of said active area;

a gate disposed over a gate insulator and extending along a gate axis, said gate being disposed between said source and drain; and two guard bands doped with a leakage-suppressing dopant on opposite sides of said active area and having axes perpendicular to said gate axis, extending inward from said edge of said active area by a dopant body distance and separated by an area of said transistor body undoped with said leakage-suppressing dopant, in which said two guard bands extend outward from an edge of said active area into said isolating dielectric by a dopant field distance.

2. A transistor according to claim 1, in which said two guard bands extend horizontally along said axis perpendicular to said gate axis from a starting point within a source of said transistor to an end point within a drain of said transistor.

3. A transistor according to claim 1, in which said dopant extends vertically below a bottom surface of said source and drain by a vertical tolerance distance.

4. A transistor according to claim 2, in which said dopant extends vertically below a bottom surface of said source and drain by a vertical tolerance distance.

5. A transistor according to claim 1, in which said dopant has a dose such that an inversion threshold gate voltage in said guard bands is greater in magnitude than a design gate voltage of said transistor, whereby said transistor body inverts in operation only between said guard bands.

6. A transistor according to claim 5, in which said two guard bands extend horizontally along said axis perpendicular to said gate axis from a starting point within a source of said transistor to an end point within a drain of said transistor.

7. A transistor according to claim 5, in which said dopant extends vertically below a bottom surface of said source and drain by a vertical tolerance distance.

8. A transistor according to claim 6, in which said dopant extends vertically below a bottom surface of said source and drain by a vertical tolerance distance.

* * * * *